United States Patent [19]

Luz

[11] 4,441,058
[45] Apr. 3, 1984

[54] DEFLECTION CIRCUIT WITH LINEARITY CORRECTION

[75] Inventor: David W. Luz, Indianapolis, Ind.
[73] Assignee: RCA Corporation, New York, N.Y.
[21] Appl. No.: 304,162
[22] Filed: Sep. 21, 1981
[51] Int. Cl.³ .......................................... H01J 29/56
[52] U.S. Cl. .................................... 315/371; 315/411; 315/408
[58] Field of Search ............... 315/408, 411, 370, 371, 315/387

[56] References Cited

U.S. PATENT DOCUMENTS

| | | |
|---|---|---|
| 3,192,433 | 6/1965 | Schneider . |
| 3,434,001 | 3/1969 | Okuda . |
| 3,796,911 | 3/1974 | Ensor et al. . |
| 3,891,800 | 6/1975 | Janssen et al. . |
| 4,024,432 | 5/1977 | Boekhorst . |
| 4,321,511 | 3/1982 | Willis .................................. 315/387 |
| 4,362,974 | 12/1982 | Dietz .................................. 315/411 |

*Primary Examiner*—Theodore M. Blum

*Attorney, Agent, or Firm*—Paul J. Rasmussen; William H. Meise; Scott J. Stevens

[57] ABSTRACT

An inverter coupled to a source of DC input voltage is operated at the horizontal deflection frequency for developing a horizontal rate square-wave supply voltage. A power transformer having a first winding excited by the square-wave supply voltage develops a horizontal rate alternating polarity output voltage across a linearity correction winding. A phase control circuit phases the alternating polarity output voltage relative to the phasing of the horizontal scanning current so as to apply a greater magnitude voltage across the horizontal deflection winding during the last half of the trace interval of each deflection cycle than during the first half of the trace interval. In this manner, linearity correction of the horizontal scanning current is obtained. The linearity correction winding is electrically disconnected from the circuit during the horizontal retrace interval in order to control the amount of power introduced into the deflection circuit via the linearity correction winding.

10 Claims, 2 Drawing Figures

DEFLECTION CIRCUIT WITH LINEARITY CORRECTION

This invention relates to linearity correction for horizontal deflection circuits.

BACKGROUND OF THE INVENTION

In a typical horizontal deflection circuit of a television receiver, the trace switch of the horizontal deflection generator applies a trace voltage developed across a trace capacitor to the horizontal deflection winding to generate an S-shaped horizontal deflection or scanning current. If dissipative losses in the horizontal deflection winding and generator were absent, the S-shaped scanning current would be a relatively symmetrical waveform. Due to dissipative losses in such elements as the trace switch and horizontal deflection winding, the scanning current waveform becomes asymmetrical, having a shallower slope than the ideal towards the end of the trace interval. Linearity distortion of the displayed raster is introduced, with the second half of each raster line being compressed relative to the first half.

To provide linearity correction of the scanning current waveform, some conventional horizontal deflection circuits include a variable impedance in series with the trace capacitor and deflection winding. The impedance of the linearity correction element is controlled so that the horizontal deflection current flowing in the impedance element encounters a smaller impedance during the second half of trace than during the first half of trace. Such a controllable impedance may comprise, for example, a saturable reactor winding having a core appropriately biased by a permanent magnet.

For television receiver picture tubes requiring large angle deflection angles, such as 100° or 110°, it may be difficult to design a relatively compact and inexpensive saturable reactor which provides the required linearity correction. Furthermore, since the average impedance of the saturable reactor for large angle deflection may comprise a substantial fraction of the impedance of the horizontal deflection winding, the reactor must be designed to withstand a proportionally higher power dissipation as well as the stress imposed by a relatively large retrace pulse voltage developed across the reactor winding.

A circuit described in U.S. patent application Ser. No. 174,864, entitled "Linearity Corrected Deflection Circuit" filed in the name of D. H. Willis and herein incorporated by reference provides linearity correction to horizontal scanning current without using a controllable impedance. A source of horizontal rate alternating polarity voltage comprising a square wave is placed in series with the source of trace voltage and the horizontal deflection winding. When the trace switch is made conductive during the trace interval of each horizontal deflection cycle, the voltage applied across the horizontal deflection winding is the sum of the trace voltage and the horizontal rate alternating polarity voltage. A phasing circuit controls the phase of the horizontal alternating polarity voltage such that linearity correction of the horizontal deflection current is obtained. The phasing is such that the sum of the trace voltage and alternating polarity voltage during the latter portion of the trace interval is greater in magnitude than the same sum during the former portion, thereby steepening the slope of the scanning current waveform during the latter portion of trace from what it otherwise would be.

The previously described circuit provides excellent linearity correction with little added expense and few additional parts. However, if the nonlinearity-causing losses are completely replaced via the linearity correction circuit, the current from the source of trace voltage which would otherwise make up the losses may approach zero during periods of the horizontal trace interval, thereby shifting the DC level of the trace voltage waveform. This may cause variations in raster scan width in response to changes in power supply loading, resulting in raster "breathing".

SUMMARY OF THE INVENTION

The present invention is directed to a horizontal deflection linearity correction circuit of the previously described alternating polarity voltage type which is not subject to problems associated with raster amplitude variations.

In accordance with the present invention, a deflection circuit with linearity correction comprises a deflection winding and a deflection generator, including a source of trace voltage and a trace switch, is coupled to the deflection winding. The deflection generator is responsive to a deflection rate switching signal for applying the trace voltage across the deflection winding to generate scanning current in the winding during a trace and a retrace interval during each deflection cycle. The trace switch incorporates a capacitor for resonating with the deflection winding during the retrace interval.

A source of deflection rate alternating polarity voltage includes phasing means coupled to the deflection generator in parallel with the resonant capacitor for applying the alternating polarity voltage in series with the trace voltage to the deflection winding. The alternating polarity voltage is applied during the trace interval in proper phase relation to the scanning current in order to provide linearity correction to the scanning current. The source of alternating polarity voltage is excluded from the retrace resonance so that the alternating polarity voltage is not applied to the deflection winding during the retrace interval.

BRIEF DESCRIPTION OF THE DRAWINGS

In the accompanying drawing.

DETAILED DESCRIPTION

Figure 1:
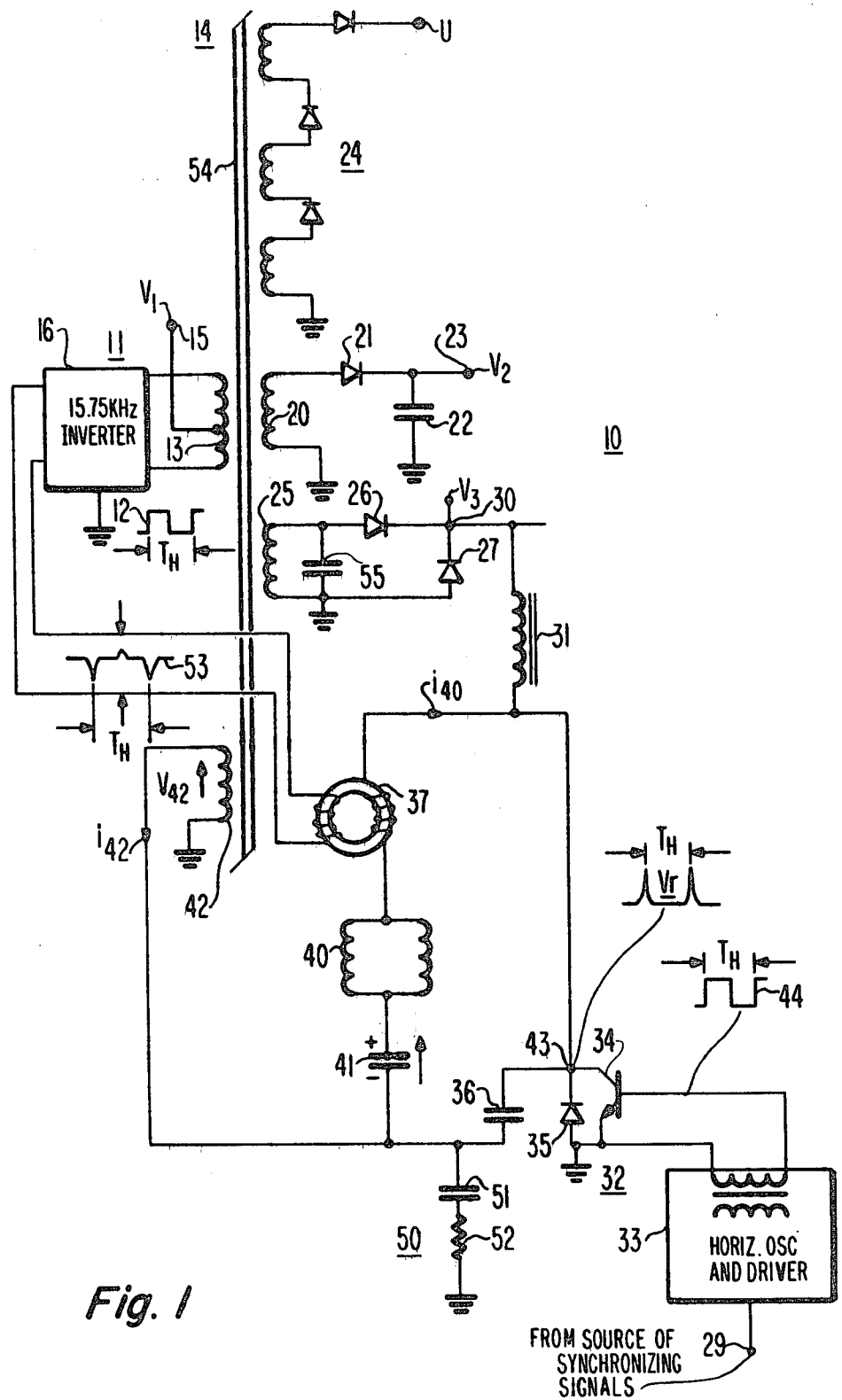
FIG. 1 illustrates a power supply and deflection circuit with linearity correction embodying the invention.

In a television receiver power supply and deflection circuit 10 of FIG. 1, a square-wave generator 11 produces a square-wave exciting or input voltage illustrated as waveform 12 which is applied to the primary winding 13 of a power transformer 14. Square-wave generator 11 comprises a source (not shown) of direct input voltage $V_1$ developed at a terminal 15 coupled to a center tap terminal of power transformer primary winding 13, and an inverter 16 which is operated at the horizontal deflection frequency, $1/T_H$, of illustratively 15.75 KHz.

Square-wave exciting voltage 12, when applied to primary winding 13, develops a horizontal deflection rate alternating polarity voltage across the output or secondary windings of power transformer 14. The voltage across a secondary winding 20 is rectified by a diode 21 and filtered by a capacitor 22 to produce an auxiliary direct voltage $V_2$ at a terminal 23. The voltage $V_2$ may power such television receiver circuits as the audio and vertical deflection circuits. Secondary or output winding 24 comprises a series of high voltage windings and rectifier diodes which produce a picture tube ultor accelerating potential at a terminal U.

The alternating polarity output voltage developed across an output winding 25 is rectified by a diode 26 and clamped by a diode 27 to produce a scanning voltage $V_3$ at a terminal 30. The scanning voltage $V_3$ is applied through an input choke 31 to energize a horizontal deflection generator 32. Horizontal deflection generator 32 comprises a conventional horizontal oscillator and driver illustrated as a block 33, a retrace capacitor 36, and a trace switch comprising a horizontal output transistor 34 and a damper diode 35 coupled across transistor 34. Horizontal oscillator and driver 33 receives horizontal synchronizing pulses via a terminal 29 from a source of synchronizing signals (not shown). Coupled across the trace switch is the series arrangement of the primary winding of a pulse transformer 37, a horizontal deflection winding or yoke 40, a trace of "S-shaping" capacitor 41, and an output winding 42 of power transformer 14. The lower terminal of retrace capacitor 36 is coupled to winding 42 of transformer 14 in parallel with winding 40 and trace capacitor 41.

Trace capacitor 41 functions as a source of trace voltage $V_{41}$ that is applied by the trace switch to horizontal deflection winding 40 during the trace interval of each horizontal deflection cycle to produce a scanning current $i_{40}$ in horizontal deflection winding 40. The trace voltage $V_{41}$ is obtained from the voltage $V_3$ by charging capacitor 41 from the input current flowing from choke 31 to a terminal 43 at the junction of choke 31 and the collector of horizontal output transistor 34.

Figure 2:
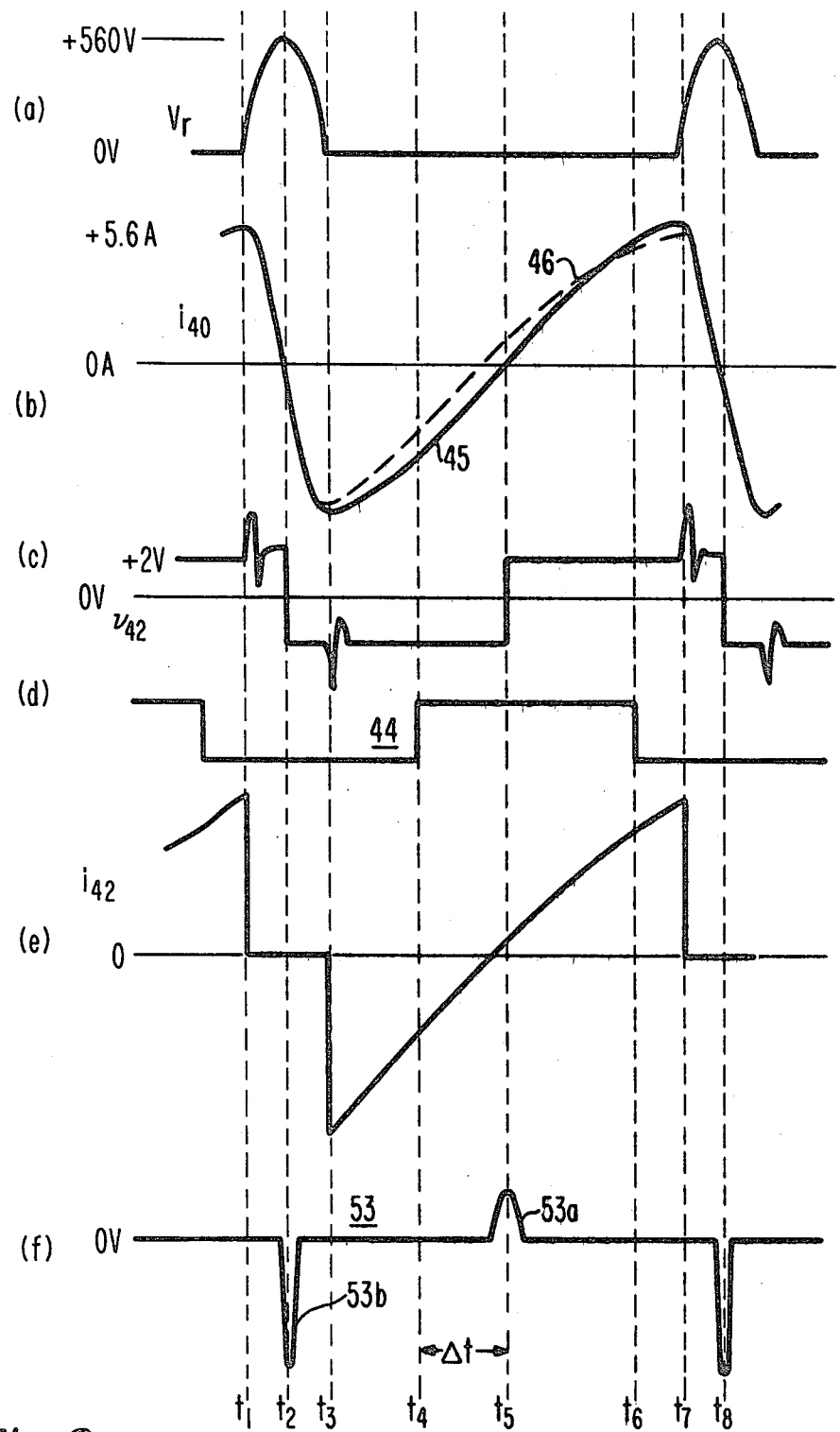
FIG. 2 illustrates waveforms associated with the circuit of FIG. 1.

To initiate the horizontal retrace interval of each deflection cycle, horizontal oscillator and driver 33 applies a deflection rate switching signal 44, illustrated schematically in FIG. 1 and in FIG. 2d, to the base of horizontal output transistor 34. As illustrated in FIG. 2d, at time $t_6$, somewhat prior to the initiation of the horizontal retrace interval at time $t_7$, square-wave switching signal 44 switches to the lower signal level, thereby applying a reverse bias voltage to the base of horizontal output transistor 34. Due to the effects of turn-off delay, collector current in horizontal output transistor does not become cut off until time $t_7$ (which corresponds to time $t_1$).

At time $t_1$, with horizontal output transistor 34 being cut off, horizontal deflection winding 40 and retrace capacitor 36 form the primary components of a resonant retrace circuit. The horizontal deflection current $i_{40}$ undergoes a one-half cycle of resonant oscillation during the horizontal retrace interval $t_1$–$t_3$, as illustrated in FIG. 2b, and a retrace pulse voltage $V_r$ is developed at terminal 43, as illustrated in FIG. 2a.

Near time $t_3$, damper diode 35 become conductive, ending the horizontal retrace interval and initiating the horizontal trace interval, which occurs between times $t_3$–$t_7$. During the horizontal trace interval, the horizontal deflection current $i_{40}$, illustrated in FIG. 2b as the solid-line waveform 45 between times $t_3$–$t_7$, first flows in damper diode 35 during the first portion of the trace interval and then flows in horizontal output transistor 34 during the second portion of the trace interval. To enable horizontal deflection current to flow in horizontal output transistor 34, square-wave switching signal 44 forward biases the transistor beginning at time $t_4$, somewhat prior to the center of horizontal trace, time $t_5$.

During the horizontal trace interval, with the trace switch conductive, the trace voltage $V_{41}$ and the deflection rate alternating polarity voltage $V_{42}$ developed across power transformer output winding 42 are applied in series across horizontal deflection winding 40 to produce the positive-going sawtooth scanning current waveform 45 between times $t_3$–$t_7$ of FIG. 2b. Deflection rate alternating polarity voltage $V_{42}$, when properly phased relative to the horizontal scanning current $i_{40}$, applies to deflection winding 40 the correct voltage waveform needed to provide linearity correction to the horizontal scanning current.

Assume, for example, that the voltage $V_{42}$ were absent; that is to say, the terminal of trace capacitor 41 remote from deflection winding 40 is directly connected to ground. During the trace interval, only the trace voltage $V_{41}$ is applied across deflection winding 40. Due to dissipative losses occurring each deflection cycle in horizontal deflection winding 40 and in the elements of horizontal deflection generator 32 such as in the trace switch, the horizontal scanning waveform $i_{40}$ departs from the ideal, substantially symmetrical, solid-line waveform 45 of FIG. 2b. The linearity distorted dashed waveform 46 is of shallower slope than the ideal during the latter portion of the trace interval, prior to time $t_7$, resulting in the display of a distorted raster wherein the last-scanned portion of each raster line appears compressed relative to the first-scanned portion.

To correct for linearity distortion, power transformer output winding 42 applies to deflection winding 40 the deflection rate alternating polarity voltage $V_{42}$ illustrate in FIG. 2c, in series with the trace voltage $V_{41}$ applied by trace capacitor 41. The phasing of the voltage $V_{42}$ is such that the sum of the trace voltage $V_{41}$ and the voltage $V_{42}$ is greater in magnitude during the latter portion of the trace interval than during the former portion of the trace interval.

As illustrated in FIG. 2c, the alternating polarity voltage $V_{42}$ is positive between times $t_5$–$t_8$, and is negative between times $t_2$–$t_5$. With the voltage applied across deflection winding 40 during the latter portion of trace between times $t_5$–$t_7$ being greater in magnitude than the voltage applied during the former portion of trace between times $t_3$–$t_5$, the slope of the horizontal deflection current $i_{40}$ is made to steepen during the latter portion of trace to result in substantially the ideal waveform 45 of FIG. 2b, as required to provide a linearity corrected scanning current.

Output winding 42 of power transformer 14 may be tightly coupled magnetically to primary winding 13 with only a relatively small magnitude leakage inductance existing between the two windings. The waveshape of the deflection rate alternating polarity voltage $V_{42}$ therefore closely follows the waveshape of the square-wave exciting voltage 12 during the horizontal trace interval.

Power flows into horizontal deflection generator 32 and horizontal deflection winding 40 each deflection cycle to replenish the dissipative losses sustained therein. One source of power flowing into horizontal deflection generator 32 is output winding 25 of power transformer 14.

Another power source to replenish losses in horizontal deflection winding 40 and horizontal deflection generator 32 is the linearity correction output winding 42.

Winding 42 serves as a source of alternating polarity voltage that is substantially in-phase with the deflection current $i_{40}$ flowing in this source. Thus, during the interval $t_5$–$t_7$, positive deflection current flows out of the terminal of winding 42 remote from the grounded terminal while that remote terminal is at a positive voltage with respect to ground, thereby producing a net power flow out of winding 42 to horizontal deflection winding 40. Similarly, during the interval $t_2$–$t_5$, negative deflection current flows into the remote terminal while that terminal is at a negative voltage with respect to ground, again resulting in a net power flow out of the winding 42 into horizontal deflection winding 40.

With linearity correction output winding 42 serving as an additional power source to replenish losses in horizontal deflection winding 40 and horizontal deflection generator 32, less power is required to flow from output winding 25, permitting lower rated components to be used in the $V_3$ power supply. Furthermore, any additional circuitry coupled between terminal 30 and deflection generator 32, such as may be used to provide side pincushion correction to the horizontal scanning current, encounters reduced stresses because of the reduced power flow required from terminal 30. Typically, winding 42 may provide about 50% or more of the power requirements of horizontal deflection winding 32 and horizontal deflection generator 40.

During the horizontal retrace interval, however, the presence of the alternating polarity voltage on winding 42 may be undesirable. Since linearity winding 42 makes up circuit losses normally resupplied via choke 31, substantially complete correction by winding 42 alone may cause the current in choke 31 to approach or reach zero at times during the horizontal interval. This may cause the DC voltage level at terminal 43 to change unpredictably, resulting in variations in horizontal scan amplitude, e.g., reaster width. In accordance with the present invention, retrace capacitor 36 is coupled to ground via linearity correction winding 42. During the horizontal trace interval, winding 42 will operate to correct linearity errors as previously described. During horizontal retrace, however, winding 42 becomes effectively disconnected, with energy being transferred between yoke 40 and retrace capacitor 36 without passing through winding 42.

The current $i_{42}$ through winding 42 is shown in FIG. 2e. It can be seen that no current flows through winding 42 during horizontal retrace $t_1$–$t_3$, therefore circuit power losses are made up via choke 31 during the retrace period. The abrupt change in winding 42 current $i_{42}$ may cause ringing in winding 42 producing oscillations in the voltage $V_{42}$. A damping or snubber circuit 50 comprising the series combination of a capacitor 51 and a resistor 52 coupled across winding 42 and ground may be required to damp the ringing.

To properly phase the substantially square-wave output voltage $V_{42}$ relative to the phasing of the scanning current $i_{40}$ to obtain linearity correction, the zero-crossover instant of the voltage $V_{42}$ is made to occur near or around the zero-crossover instant of the scanning current during trace, near time $t_5$ of FIGS. 2b and 2c. To provide the correct phasing information, the zero-crossover instants of the horizontal scanning current are detected by pulse transformer 37 in the form of a pulse voltage waveform 53 shown in FIG. 2f, developed across the secondary winding of the pulse transformer 37. The pulse voltage 53 is applied to inverter 16 to adjust the phase of exciting voltage 12 and thus to adjust the phase of output voltage $V_{42}$ so that the positive-going transition of the voltage $V_{42}$ occurs near the center of trace at time $t_5$, as illustrated in FIGS. 2b, 2c and 2f.

Pulse transformer 37 may be designed as a saturable, toroidal core transformer. Deflection current flowing through the primary winding of the transformer maintains the core in magnetic saturation during substantially the entire horizontal deflection cycle except near the zero-crossover instants $t_2$ and $t_5$ of the horizontal deflection current $i_{40}$ of FIG. 2b. When the core is magnetically saturated, no output voltage is developed across the secondary winding of pulse transformer 37. Near the zero-crossover instants of the deflection current, the core of transformer 37 comes out of saturation, producing a pulse voltage 53a near the center of horizontal trace, near time $t_5$ of FIG. 2f, and producing a pulse voltage 53b near the center of horizontal retrace, near time $t_2$. By applying pulse voltage 53 to inverter 16, the correct phasing of square-wave output voltage $V_{42}$ relative to the phasing of the horizontal scanning current $i_{40}$ may be provided to obtain linearity correction, as previously explained. The design and construction of pulse transformer 37 and the phasing of inverter 16 thereby is described in a copending U.S. patent application of D. W. Luz and D. H. Willis, Ser. No. 174,943, filed Aug. 4, 1980, entitled "TELEVISION RECEIVER, PUSH-PULL INVERTER, FERRORESONANT TRANSFORMER POWER SUPPLY SYNCHRONIZED WITH HORIZONTAL DEFLECTION", hereby incorporated by reference.

FIG. 2c illustrates the positive-going transition of the linearity correction voltage waveform $V_{42}$ as occurring at the center of trace, at time $t_5$. This transition may be made to occur somewhat earlier than time $t_5$ or somewhat later than time $t_5$ while still providing acceptable linearity correction. For example, assuming a horizontal trace interval of around 51 microseconds, a positive-going transition occurring within an interval of ±6 microseconds centered around time $t_5$ has provided satisfactory linearity correction to the horizontal scanning current $i_{40}$.

Power transformer 14 may be constructed as a conventional switching power transformer with all of the output windings 20, 24 and 25 being tightly coupled to the primary winding 13. Alternatively, power transformer 14 may be constructed as a ferroresonant power transformer with the supply voltage windings 20, 24 and 25 wound around a portion of the transformer core 54 that magnetically saturates during each half cycle of the exciting voltage 12 to provide regulated output voltages across each of the windings 20, 24 and 25. To provide a circulating current that generates a magnetic flux that aids in saturating the core portion under windings 20, 24 and 25, a capacitor 55 may be coupled across winding 25. The design and construction of a ferroresonant power transformer 14 including one with a high voltage winding 24, may be similar to that described in the U.S. patent application of F. S. Wendt, Ser. No. 144,150, filed Apr. 28, 1980, a continuation of Ser. No. 007,815, filed Jan. 30, 1979, now abandoned, both applications being entitled "HIGH FREQUENCY FERRORESONANT POWER SUPPLY FOR A DEFLECTION AND HIGH VOLTAGE CIRCUIT", hereby incorporated by reference.

When using a ferroresonant power transformer 14 the regulated output windings such as windings 20, 24 and 25 are loosely coupled magnetically with primary winding 13. The waveform of the voltages across these output windings may be somewhat sinusoidal or may not have relatively sharply sloped positive and negative-going transitions. To provide sharply sloped transitions to the output voltage developed across linearity correction output winding 42, the output winding 42 may be tightly coupled magnetically with the primary winding 13 rather than being tightly coupled with any one of the other output windings 20, 24 and 25.

If the DC input voltage $V_1$ is unregulated in amplitude, as may be the case when using a ferroresonant power transformer to provide regulated voltages across output windings 20, 24 and 25, the amplitude of the square-wave voltage $V_{42}$ will vary with amplitude variations in the input voltage $V_1$. Typically the input voltage $V_1$ may vary about $\pm 10\%$ around its nominal value, producing a variation in the amplitude of the voltage $V_{42}$ of around $\pm 10\%$. Such an amplitude variation of the voltage $V_{42}$ will result in a smaller variation in the linearity correction provided, substantially less than a 5% variation, for example. Such a small variation in linearity correction will have little deleterious effect on the observed raster.

Using the linearity correction arrangement of FIG. 1, embodying the invention, linearity correction is readily obtained for wide angle deflection systems which may have a relatively poor deflection winding L/R ratio of, for example, 0.6 millihenry per ohm. Such wide angle deflection systems may require 10 to 15 percent linearity correction to the horizontal deflection current. Conventional techniques for linearity correction, such as connecting a variable impedance in series with the deflection winding, either have relative difficulty in providing the required amount of linearity correction or require the use of relatively expensive components such as saturable reactors. Saturable reactors use permanent magnets to control the magnetic bias of the core. Adjustable magnets are sometimes required to properly set the bias point. The linearity correction arrangement of FIG. 1 gives a predictable amount of correction requiring no adjustment procedure, yet advantageously functions as an additional source of power input to aid in replacement of circuit losses. The power supplied, however, does not adversely affect the operation of the receiver, but merely reduces the power required from other sources.

What is claimed is:

1. A deflection circuit with linearity correction, comprising:
   a deflection winding;
   a deflection generator including a source of trace voltage and a trace switch coupled to said deflection winding and responsive to a deflection rate switching signal for applying said trace voltage across said deflection winding each deflection cycle to generate scanning current during a trace and a retrace interval of each deflection cycle in said deflection winding, said trace switch incorporating a capacitor for resonating with said deflection winding during said retrace interval;
   a source of deflection rate alternating polarity voltage coupled to said resonant capacitor and said deflection winding; and
   phasing means for applying said alternating polarity voltage to said deflection winding during said trace interval in proper phase relation to said scanning current in order to provide linearity correction to said scanning current, said source of alternating polarity voltage being so coupled to be excluded from said retrace resonance such that said alternating polarity voltage is not applied to said deflection winding during said retrace interval.

2. The arrangement defined in claim 1 wherein the sum of said trace voltage and said deflection rate alternating polarity voltage is greater in magnitude during substantially all of the later scanned portion of said trace interval of each deflection cycle than during substantially all of the earlier scanned portion of said trace interval.

3. The arrangement defined in claim 1 wherein power flows from said source of deflection rate alternating polarity voltage to said deflection winding to replace power losses sustained in said deflection winding and said deflection generator only during said trace interval.

4. The arrangement defined in claim 1, wherein said trace switch comprises a transistor and a capacitor coupled in parallel with said transistor, said trace switch coupled in series with said source of deflection rate alternating polarity voltage such that said alternating polarity voltage source is decoupled from said trace switch during said retrace interval.

5. The arrangement defined in claim 1, wherein said source of deflection rate alternating polarity voltage comprises a square-wave generator and a power transformer, said square-wave generator developing a square-wave exciting voltage that is applied to the primary winding of said power transformer, a second winding of said power transformer having developed thereacross said deflection rate alternating polarity voltage.

6. A circuit according to claim 5, wherein said power transformer comprises a ferroresonant power transformer for regulating the voltage developed across said output winding against variations of said exciting voltage.

7. A power supply and linearity corrected deflection circuit, comprising:
   a source of square-wave supply voltage repeating at a horizontal deflection frequency;
   a power transformer having a first winding excited by said square-wave supply voltage for developing a horizontal deflection frequency alternating polarity output voltage across second and third windings of said power transformer;
   a horizontal deflection winding;
   a horizontal deflection generator comprising a trace switch incorporating a retrace capacitor coupled to said power transformer second winding and energized thereby to develop a trace voltage across a trace capacitance, said deflection generator coupled to the series arrangement of said deflection winding, trace capacitance and power transformer third winding, said trace capacitance and said third winding forming a junction therebetween, said series coupling responsive to a horizontal deflection frequency switching signal for generating horizontal deflection current in said deflection winding during trace and retrace intervals of each deflection cycle, said retrace capacitor having a first terminal coupled to said second winding and a second terminal coupled to said juncture such that said retrace capacitor resonates with said deflection winding during said retrace interval; and
   means for applying said alternating polarity output voltage from said transformer third winding to said horizontal deflection winding during said trace interval in proper phase relation to obtain linearity correction of said deflection current, said third winding output voltage being excluded from said retrace resonance via said coupling of said retrace capacitor second terminal.

8. The arrangement defined in claim 7, wherein said applying means phases said alternating polarity output voltage so as to increase the magnitude of the voltage applied across said deflection winding during a later portion of said trace interval than that applied during an earlier portion.

9. The arrangement defined in claim 7, wherein said power transformer comprises a ferroresonant transformer for regulating the voltage developed across said ferroresonant transformer second winding against variations of said input voltage.

10. An improved linearity corrected deflection circuit comprising:
- a source of direct energizing voltage;
- deflection switch means coupled to said voltage source at a juncture and operated at the deflection rate to define periodic trace and retrace intervals;
- a deflection winding;
- a source of linearity correction voltage alternating in polarity at said deflection rate;
- means for coupling said deflection winding to said source of linearity correction voltage for applying said linearity correction voltage to said deflection winding;
- retrace capacitance means having an electrode coupled to said juncture for resonating with said deflection winding during said retrace intervals, wherein the improvement lies in that the second electrode of said retrace capacitance means is coupled to the junction of said source of linearity correction voltage and said deflection winding for excluding said source of linearity correction voltage from said retrace resonance.

* * * * *